US011533059B1

(12) United States Patent
Brandonisio et al.

(10) Patent No.: US 11,533,059 B1
(45) Date of Patent: Dec. 20, 2022

(54) FREQUENCY GENERATION WITH DYNAMIC SWITCHING BETWEEN CLOSED-LOOP OPERATION AND OPEN-LOOP OPERATION

(71) Applicant: Infineon Technologies AG, Neubiberg (DE)

(72) Inventors: Francesco Brandonisio, Villach (AT); Emanuele Brazzo, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/361,617

(22) Filed: Jun. 29, 2021

(51) Int. Cl.
*H03L 7/197* (2006.01)
*H03L 7/099* (2006.01)

(52) U.S. Cl.
CPC .......... *H03L 7/1976* (2013.01); *H03L 7/0992* (2013.01)

(58) Field of Classification Search
CPC ................ H03L 7/1976; H03L 7/0992
See application file for complete search history.

(56) References Cited

U.S. PATENT DOCUMENTS

| | | | |
|---|---|---|---|
| 5,223,772 A * | 6/1993 | Carobolante | H03L 7/12 318/400.11 |
| 5,703,538 A * | 12/1997 | Lo | H03L 7/12 331/25 |
| 6,084,737 A * | 7/2000 | Higurashi | G11B 15/4671 |
| 8,686,771 B2 * | 4/2014 | Frantzeskakis | H03L 7/1976 327/159 |
| 8,803,716 B1 * | 8/2014 | Munnan | H03M 1/109 714/E11.154 |
| 9,559,703 B2 * | 1/2017 | Cenger | H03L 7/08 |
| 9,680,482 B2 * | 6/2017 | Jia | H03L 7/0898 |
| 10,727,845 B1 * | 7/2020 | Balakrishnan | H03L 7/093 |
| 10,790,838 B1 * | 9/2020 | Mosalikanti | H03L 7/085 |
| 10,879,953 B1 * | 12/2020 | Hyman | H04B 1/7136 |
| 2012/0038809 A1 * | 2/2012 | Lee | H04N 5/3575 348/308 |
| 2019/0007055 A1 * | 1/2019 | Nelson | H03L 7/0807 |
| 2021/0389353 A1 * | 12/2021 | Bhargava | H03K 21/08 |

FOREIGN PATENT DOCUMENTS

CN        113054999 A  *  6/2021  .......... H03L 7/0991

* cited by examiner

*Primary Examiner* — Adam D Houston
(74) *Attorney, Agent, or Firm* — Eschweiler & Potashnik, LLC

(57) ABSTRACT

Some examples relate to a frequency synthesizer. The frequency synthesizer includes an oscillator including an input terminal and an output terminal. A frequency locked-loop or phase-locked loop (FLL/PLL) unit is arranged on a feedback path extending between the output terminal of the oscillator and the input terminal of the oscillator. A switching unit is configured to selectively switch between a first mode of operation in which the feedback path is closed and the FLL/PLL unit is coupled to the input terminal of the oscillator, and a second mode of operation in which the feedback path is open and a ramping unit is coupled to the input terminal of the oscillator while the feedback path is open.

23 Claims, 6 Drawing Sheets

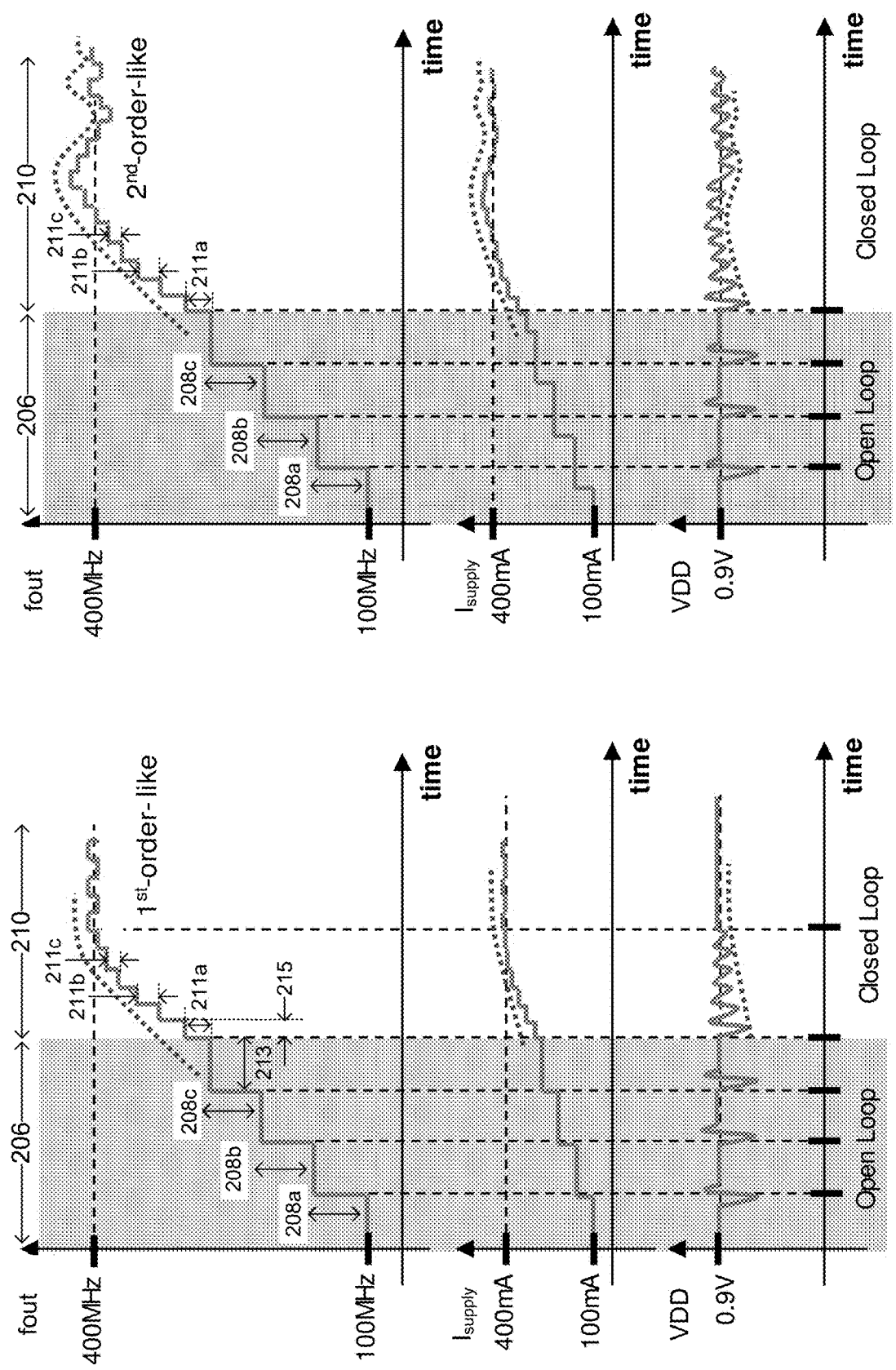

FREQUENCY GENERATION WITH DYNAMIC SWITCHING BETWEEN CLOSED-LOOP OPERATION AND OPEN-LOOP OPERATION

FIELD

The present disclosure relates in general to frequency synthesizers, and more particularly, to frequency synthesizers with dynamic switching between closed-loop operation and open-loop operation.

BACKGROUND

A frequency synthesizer is an electronic circuit that generates a range of frequencies from a reference frequency. Frequency synthesizers are used in many modern devices such as radio receivers, televisions, mobile telephones, radio telephones, walkie-talkies, CB radios, cable television converter boxes, satellite receivers, radar and Global Positioning Satellite (GPS) systems. A frequency synthesizer may use the techniques of frequency multiplication, frequency division, direct digital synthesis, frequency mixing, frequency-locked loops, and phase-locked loops to generate its frequencies.

BRIEF DESCRIPTION OF THE DRAWINGS

FIGS. 3-4 illustrate additional waveform diagrams illustrating a DCO signal, a current load signal, and a VDD signal consistent with some example of FIG. 1's frequency synthesizer.

DETAILED DESCRIPTION

Figure 1:
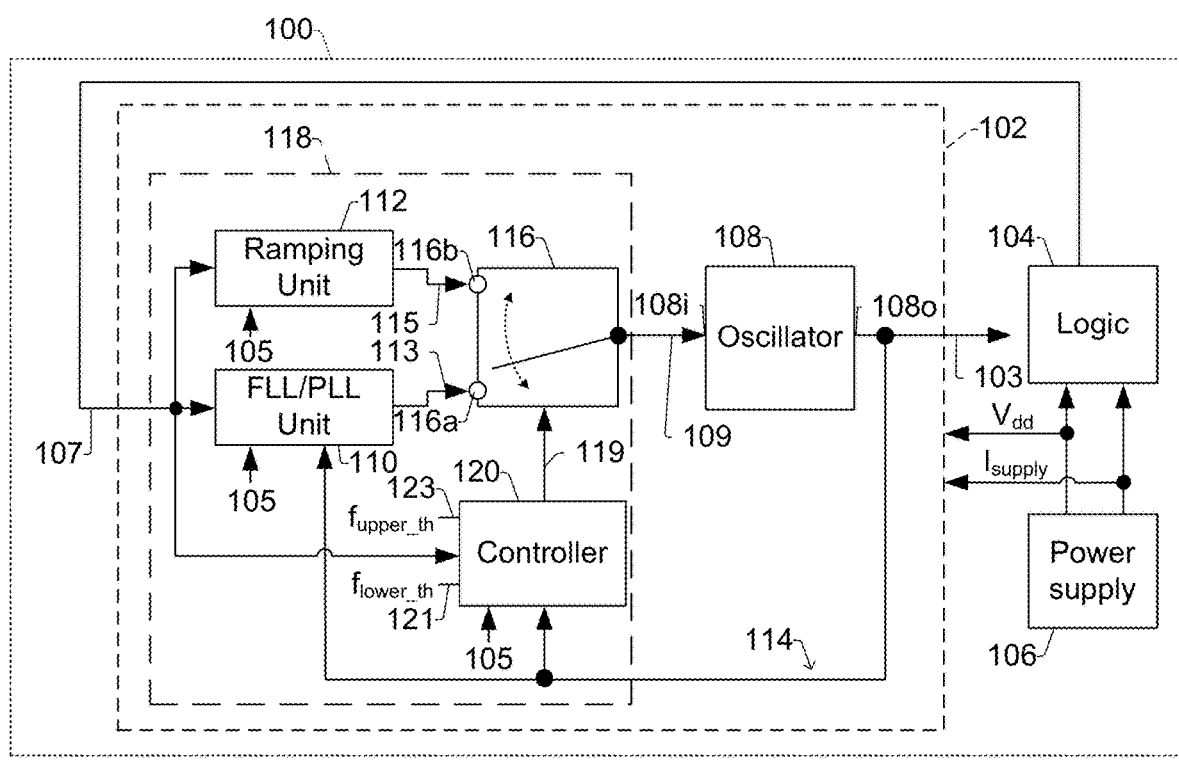
FIG. 1 illustrates a frequency synthesizer in accordance with some embodiments.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware.

A frequency synthesizer is a component in a circuit that generates a range of time-varying output frequencies from a reference clock signal having a reference frequency. For example, a frequency synthesizer can receive a reference clock signal having a reference frequency at 10 MHz, and can generate a time-varying output frequency that varies in time between 100 MHz and 500 MHz. However, when the output frequency is changed, this change in output frequency can be associated with a large jump for the power supply module of the frequency synthesizer itself or of any circuitry that is clocked by the output of the frequency synthesizer. Hence, a time-varying output frequency can cause the current and/or voltage delivered to the frequency synthesizer itself or to any circuitry that is clocked by the output of the frequency synthesizer to "dip", "spike", and/or "ripple" in an undesirable manner.

Therefore, as will be appreciated in more detail herein, some aspects of the present disclosure relate to frequency synthesizer systems and methods that switch between open-loop operation and closed-loop operation to achieve a blend of good performance while mitigating undesirable "dips", "spikes", and/or "ripples" in the current and/or voltage delivered to the circuit.

FIG. 1 illustrates a circuit 100 including frequency synthesizer 102 in accordance with some embodiments. In addition to the frequency synthesizer 102, the circuit 100 includes a logic block 104 and a power supply module 106. The power supply module 106 provides a supply current (isupply) and a supply voltage (Vdd) to the frequency synthesizer 102 and to the logic block 104, for example, via a supply grid or mesh.

During operation, the frequency synthesizer 102 generates an output frequency signal 103 having a time-varying output frequency $f_{out}$ based on a reference clock signal 105 having a well-defined reference frequency. This output frequency signal 103 can be set to track a target frequency signal 107 having a time-varying target frequency $f_{target}$. For example, in some implementations, the reference clock signal 105 can have a reference frequency at 10 MHz, and the output frequency $f_{out}$ of the output frequency signal 103 varies in time between 100 MHz and 500 MHz, commensurate with the target frequency signal 107. Other reference frequencies and output frequencies can also be used, and these stated frequency values are merely an example provided for clarity.

To provide a streamlined design and to mitigate jumps in the current and/or voltage from the power supply module 106 due to changes in output frequency, the frequency synthesizer 102 includes an oscillator 108, a frequency locked-loop or phase-locked loop (FLL/PLL) unit 110, and a ramping unit 112, which are operably coupled as shown. The FLL/PLL unit 110 is arranged on a feedback path 114 extending between an oscillator output terminal 108o and an oscillator input terminal 108i. A switching unit 116 is configured to selectively switch between a closed-loop mode of operation in which the feedback path 114 is a closed-loop (e.g., such that the FLL/PLL unit 110 is coupled to the input terminal 108i of the oscillator), and an open-loop mode of operation in which the feedback path 114 is open (e.g., such that the ramping unit 112 is coupled to the oscillator input terminal 108i while the feedback path 114 is open).

The FLL/PLL unit 110 and the ramping unit 112 are configured to receive the target frequency signal 107 and provide a frequency code word 109 to the oscillator input terminal 108i based on the target frequency signal 107. The oscillator 108 is configured to generate the output frequency signal 103, such that the output frequency signal 103 generally tracks the target frequency signal 107 in time.

For example, in FIG. 1, the switching unit 116 is configured to selectively switch between a first switch position 116a and a second switch position 116b. When the switching unit is set to the first switch position 116a, the switching unit couples the FLL/PLL unit 110 to the oscillator input terminal 108$i$, thereby forming a closed-loop for the feedback path 114—this mode of operation is referred to as "closed-loop" mode. During closed-loop mode, the FLL/PLL unit 110 compares the output frequency signal 103 to the target frequency signal 107, and generates an error frequency code word signal 113 to set the frequency code word 109 during closed-loop mode. In contrast, when the switching unit is set to the second switch position 116$b$, the switching unit opens or breaks the feedback path 114 and couples the ramping unit 112 to the oscillator input terminal 108$i$—this mode of operation is referred to as "open-loop" mode. During open-loop mode, the ramping unit 112 generates a ramp frequency code word signal 115 based on the target frequency signal 107 without evaluating the output frequency signal 103, to set the frequency code word 109.

By switching between "open-loop" mode and "closed-loop" mode, the frequency synthesizer in FIG. 1 provides a balance of good performance while mitigating undesirable "dips", "spikes", and/or "ripples" in the current and/or voltage delivered from the power supply module 106 to the frequency synthesizer 102 and to the logic block 104. This is because the "closed-loop" mode may be more precise due to the presence of the FLL/PLL unit 110 which allows for more accurate "tuning" of the output frequency signal 103 to match the target frequency signal 107 due to the use of the feedback path 114 and which can suppress supply and temperature variations. However, the FLL/PLL unit 110 and feedback path 114 may also adjust the output frequency signal 103 more slowly and/or may consume more power than the ramping unit 112. Moreover, the FLL/PLL unit 110 needs to meet stability criteria for feedback systems, such as a good phase margin. By contrast, the ramping unit 112 is inherently stable, because it does not use the feedback path 114 when it is controlling the oscillator 108. To balance the "closed-loop" mode, the "open-loop" mode where the ramping unit 112 is coupled to the oscillator input terminal 108$i$ without the use of the feedback path 114 allows for more rapid adjustments of the output frequency signal 103 and/or may consume less power than closed-loop mode. Therefore, this frequency synthesizer 102 provides a streamlined design with a good balance of fast and accurate switching with limited "dips", "spikes", or "ripples" in supply current and/or supply voltage, and provides reasonable power consumption levels.

It will be appreciated that although FIG. 1. Illustrates the switching unit 116 as a circuit element having a first switch position 116$a$ and a second switch position 116$b$, in other instances the switching unit 116 can be implemented in software or firmware running on a microcontroller. Thus, in some cases, the FLL/PLL unit 110, the ramping unit 112, and the switching unit 116 are implemented as a digital circuit 118, and the oscillator 108 is implemented as an analog circuit configured to output the output frequency signal 103 based on the frequency control word 109. The digital circuit 118 can include a microcontroller, memory, and/or application specific integrated circuit (ASIC) configured to execute instructions in software or firmware and to provide the time-varying frequency control word 109 based on the target frequency signal 107.

Figure 2:
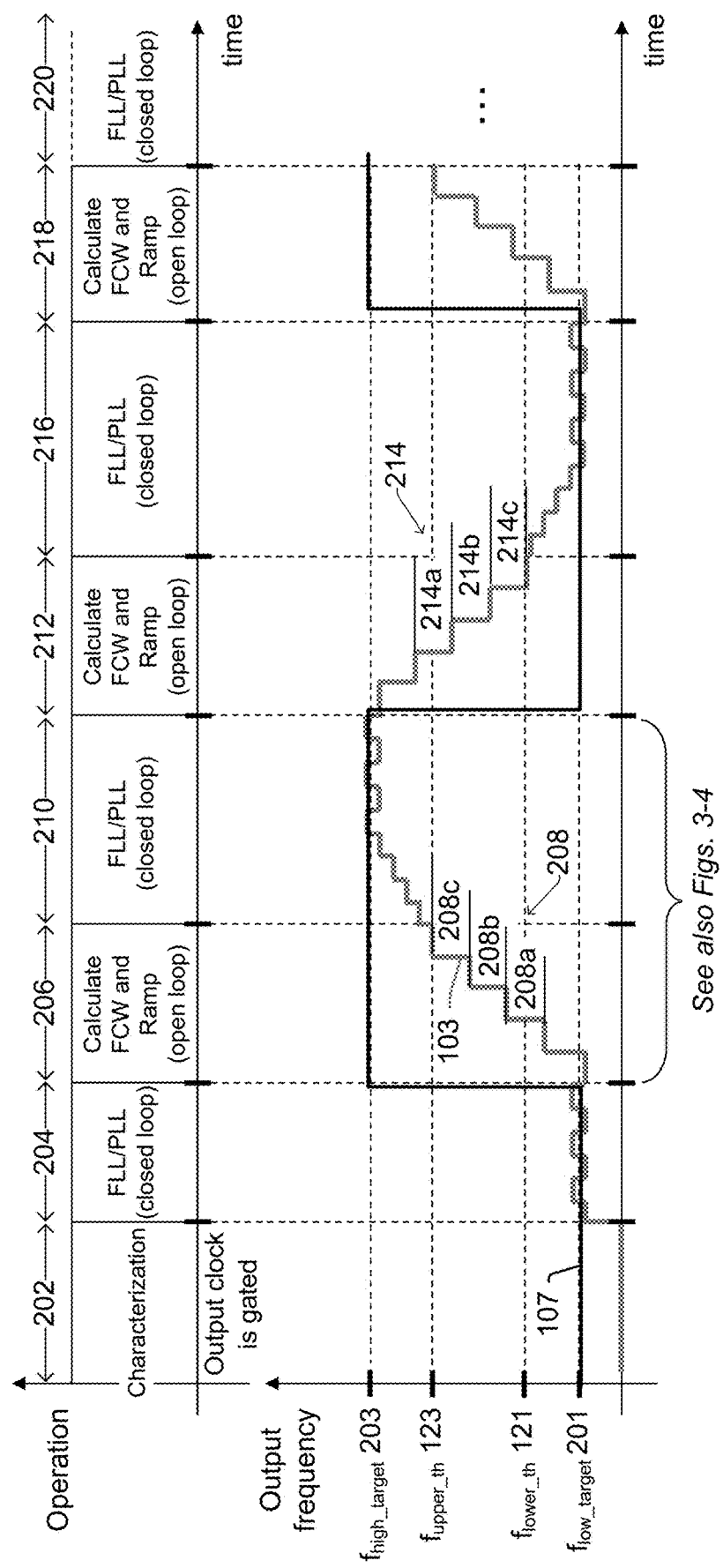
FIG. 2 illustrates a waveform diagram illustrating a DCO signal whose frequency varies in time consistent with some example of FIG. 1's frequency synthesizer.

Further, as will be appreciated more fully with regards to FIG. 2, the frequency synthesizer of FIG. 1 also includes a controller 120 configured to perform a comparison of the target frequency signal 107 and the output frequency signal 103, and to set a state of a control signal 119 provided to the switching unit 116 based on the comparison. The controller 120 is also configured to compare the target frequency signal 107 and/or the output frequency signal 103 to a lower frequency threshold ($f_{lower\_th}$ 121) and an upper frequency threshold ($f_{upper\_th}$ 123), and to set the state of the control signal 119 based on this comparison. In some embodiments, the lower frequency threshold 121 and/or the upper frequency threshold are multi-time programmable or one-time programmable, and can be stored in non-volatile memory and/or can be set by fuses or dip-switches, for example, but in other embodiments the lower frequency threshold 121 and/or the upper frequency threshold are hard-coded values or are written on the fly.

Referring now to FIG. 2, one can see an example waveform diagram illustrating the target frequency signal 107 and the output frequency signal 103 for the frequency synthesizer 102 of FIG. 1. Generally, FIG. 2 depicts how the target frequency signal 107 changes between a first target frequency (e.g., low target frequency, $f_{low\_target}$ 201) and a second target frequency (e.g., high target frequency, $f_{high\_target}$ 203) in time, and how the output frequency signal 103 has an output frequency $f_{out}$ that generally "tracks" the target frequency $f_{target}$ of the target frequency signal 107.

During a first time 202, characterization is performed to calibrate the frequency synthesizer, during which the output frequency signal 103 may be gated or set to 0 Hz.

During a second time 204, the target frequency signal 107 is set to the low target frequency 201, wherein the low target frequency 201 is less than the lower frequency threshold 121. Thus, referring briefly back to FIG. 1, during this second time, the controller 120 detects the target frequency is lower than the lower frequency threshold 121, and in response sets a state of the control signal 119 to set the switching unit 116 to the first switch position 116$a$. Thus, during the second time 204, the FLL/PLL unit 110 is coupled to the oscillator input terminal 108$i$, and the frequency synthesizer operates in a closed-loop mode. As such, in FIG. 2, the output frequency signal 103 generally tracks the target frequency signal 107, which is set to $f_{target\_low}$ during the second time 204. The output frequency signal 103 may exhibit small oscillations during the second time 204 because of small adjustments made by the FLL/PLL unit 110 on the feedback path 114.

In FIG. 2, during a third time 206, the target frequency of the target frequency signal 107 is increased to a high target frequency 203, and the frequency synthesizer operates in open-loop mode to increase the output frequency of the output frequency signal 103 from the low target frequency 201 to an upper frequency threshold 123. Thus, referring briefly back to FIG. 1, during this third time 206, the controller 120 detects the target frequency of the target frequency signal 107 has been increased and the output frequency of the output frequency signal 103 is less than upper frequency threshold 123, and in response, sets a state of the control signal 119 to set the switching unit 116 to the second switch position 116$b$. Thus, during the third time, the ramping unit 112 is coupled to the oscillator input terminal 108$i$, and the frequency synthesizer operates in an open-loop mode during the third time. As such, in FIG. 2, the output frequency of the output frequency signal 103 is ramped up until the output frequency is greater than or equal to the upper frequency threshold 123. In some cases, the ramping unit 112 is configured to iteratively adjust the frequency code word in discrete steps to adjust the output frequency signal 103 according to a first uniform frequency step size throughout the third time 206 during the open-loop mode of operation (see 208$a$-208$c$ in FIGS. 2, and 208$a$-208$c$ in FIGS. 3-4, which can induce a first current ripple having a first magnitude from a power supply module).

In FIG. 2, during a fourth time 210, the target frequency signal 107 is still set to the high target frequency 203, and the controller 120 of FIG. 1 detects the output oscillator frequency has now met or exceeded the upper frequency threshold 123. In response, the controller 120 changes the state of the control signal 119 to set the switching unit 116 back to the first switch position 116a. Thus, during the fourth time 210, the FLL/PLL unit 110 is re-coupled to the oscillator input terminal 108i, and the frequency synthesizer again operates in a closed-loop mode. As such, the output frequency of the output frequency signal 103 now slowly increases until the $f_{high\text{-}target}$ 203 is reached, and the output frequency then remains at or oscillates about $f_{high\text{-}target}$ so long as target frequency signal 107 remains at $f_{high\text{-}target}$ 203. Because the FLL/PLL unit 110 makes use of the feedback path 114, it accounts for real-time variations in the output frequency and thus, can adjust the output frequency signal 103 during the closed-loop mode of operation according to different steps sizes that vary from the first uniform step size. Often, the different step sizes used in closed-loop mode are smaller than the first uniform step size used in open-loop mode, which gives more precise control, but also provides slower frequency tuning compared to the open-loop mode. This can be seen more clearly in FIGS. 3-4, where during the fourth time 210 different frequency step sizes 211a, 211b, 211c are used, and these induce a second current ripple having a second magnitude from the power supply module, the second magnitude being less than the first magnitude during third time 206. Also, the time interval for each step during closed-loop mode may be different than (e.g., shorter than) open-loop mode—compare 213 and 215 in FIGS. 3-4.

During a fifth time 212, the target frequency signal 107 is changed back to the low target frequency 201, and the frequency synthesizer operates in open-loop mode to decrease the output frequency of output frequency signal 103 from the high target frequency 203 until the output frequency reaches the lower frequency threshold 121. Thus, referring briefly back to FIG. 1, during this fifth time, the controller 120 detects the target frequency has been decreased and the output frequency is greater than lower frequency threshold 121, and in response, sets a state of the control signal 119 to set the switching unit 116 to the first switch position 116a. Thus, during the fifth time, the ramping unit 112 is re-coupled to the oscillator input terminal 108i, and the frequency synthesizer operates in an open-loop mode during the fifth time. As such, in FIG. 2, the output frequency is ramped down until the output frequency is less than or equal to the lower frequency threshold 121. In some cases, the ramping unit 112 is configured to iteratively adjust the frequency code word in discrete steps to adjust the output frequency signal 103 according a second uniform step size (see 214a-c in FIG. 2) throughout the fifth time 212 during the open-loop mode of operation. The second uniform step size 214 is often equal to the first uniform step size 208, but could also differ from the first uniform step size.

In FIG. 2, during a sixth time 216, the target frequency is still set to the low target frequency 201, and the controller 120 of FIG. 1 detects the output frequency is now less than or equal to the lower frequency threshold 121. In response, the controller 120 changes the state of the control signal 119 to set the switching unit 116 back to the first switch position 116a. Thus, during the sixth time 216, the FLL/PLL unit 110 is re-coupled to the oscillator input terminal, and the frequency synthesizer again operates in a closed-loop mode. As such, the output frequency now slowly decreases until the $f_{low\text{-}target}$ 201 is reached. At this point, the output frequency then remains at or oscillates about $f_{low\text{-}target}$ 201 so long as the target frequency signal 107 remains at $f_{low\text{-}target}$ 201. Because the FLL/PLL unit 110 makes use of the feedback path 114, it accounts for real-time variations in the output frequency and thus, can adjust the output frequency signal 103 during the closed-loop mode of operation according to different steps sizes that vary from the first uniform step size. Often, the different step sizes used in closed-loop mode are less than the first uniform step size used in open-loop mode, which gives more precise control, but also provides slower frequency tuning compared to the open-loop mode.

During a seventh time 218, the target frequency is again increased to a high target frequency 203, and the frequency synthesizer switches to open-loop mode to increase the output frequency from the low frequency until the upper frequency threshold 123 is reached, much like during third time 206. Then, in eighth time 220, after the output frequency reaches the upper frequency threshold 123, the frequency synthesizer switches to closed-loop mode until the high target frequency 203 is reached, and so on.

Although FIG. 2 shows an example where the frequency synthesizer varies between two frequencies (e.g., a first, low frequency and a second, high frequency) where closed-loop mode is used, in other embodiments, closed-loop mode could also be used for more than two frequencies. For instance, the closed-loop mode could be used for the low frequency, the high frequency, and an intermediate frequency between the low frequency and the high frequency, and the ramping unit can use open-loop mode between the low frequency and intermediate frequency, and then again use the open-loop mode between the intermediate frequency and the high frequency. Thus, compared to the two-frequency frequency synthesizer discussed in FIG. 2, this disclosure is also applicable to three-frequency frequency synthesizers and high-level frequency synthesizers as well that employ dynamic switching between an open-loop operating mode and a closed-loop operating mode.

Figure 5:
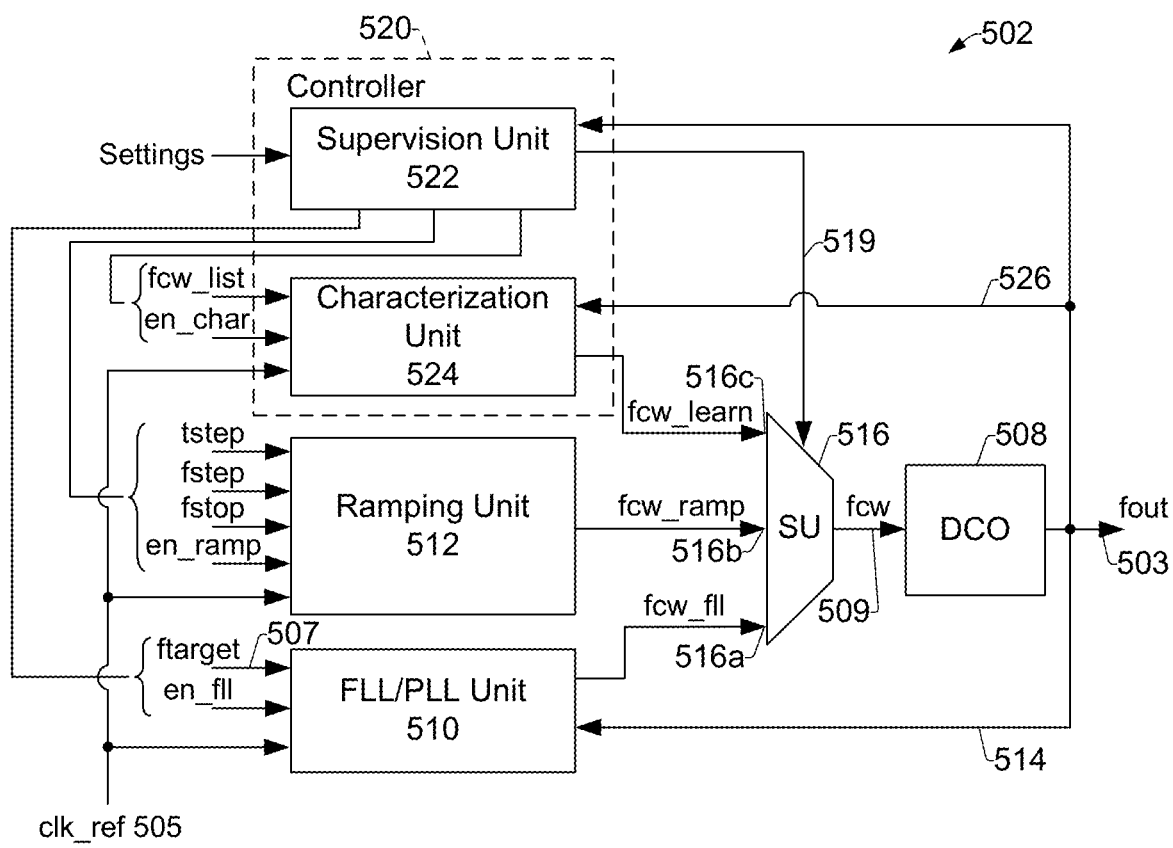
FIG. 5 illustrates another embodiment of a frequency synthesizer in accordance with some embodiments.
Figure 6:
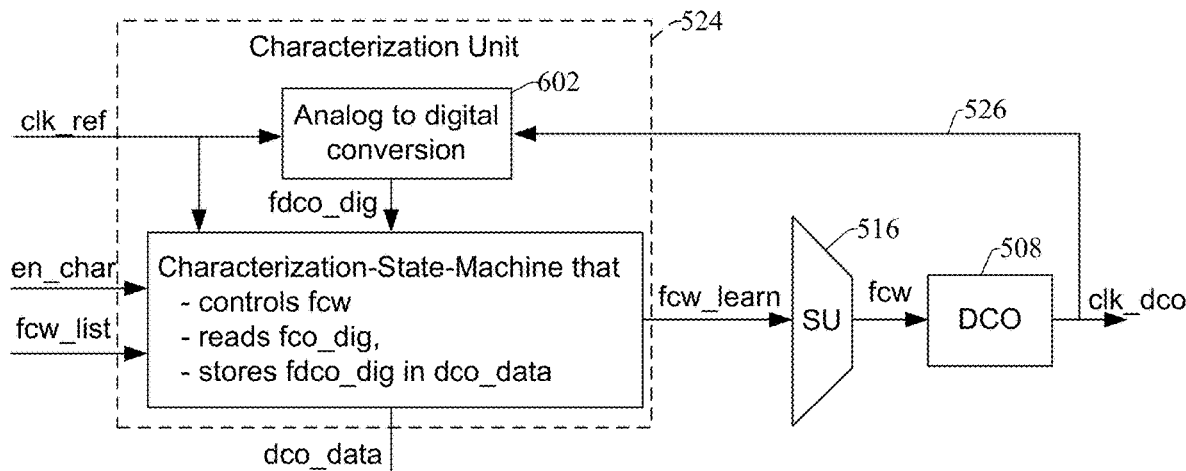
FIG. 6 illustrates a portion of a frequency synthesizer including a more detailed characterization unit in accordance with some embodiments.
Figure 7:
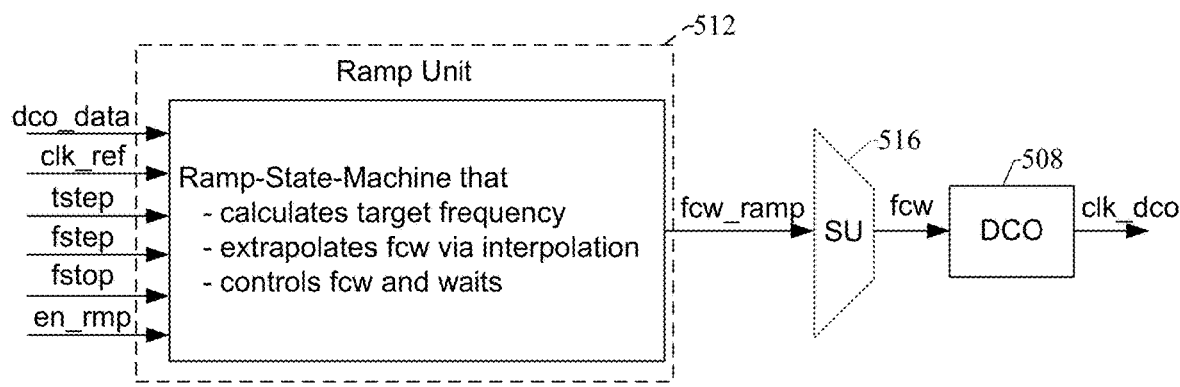
FIG. 7 illustrates a portion of a frequency synthesizer including a more detailed ramping unit in accordance with some embodiments.
Figure 8:
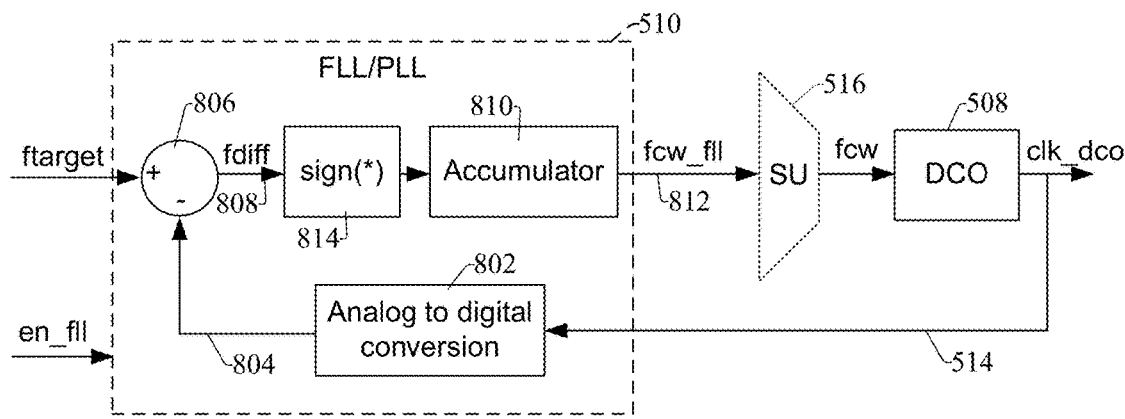
FIG. 8 illustrates a portion of a frequency synthesizer including a more detailed FLL/PLL unit in accordance with some embodiments.

FIG. 5 depicts a more detailed example block diagram of a frequency synthesizer 502, and FIGS. 6-8 depict more detailed example block diagrams of the sub-blocks within the frequency synthesizer of FIG. 5. Like the frequency synthesizer of FIG. 1, the frequency synthesizer 502 includes an oscillator 508, a FLL/PLL unit 510, and a ramping unit 512, which are operably coupled as shown. The FLL/PLL unit 510 is arranged on a feedback path 514 extending between an output terminal of oscillator 508 and input terminal of oscillator 508. A switching unit 516, which can be a multiplexer, is configured to selectively switch, under direction of controller 520, between a closed-loop mode of operation in which the feedback path 514 is a closed-loop (e.g., such that the FLL/PLL unit 510 is coupled to the input terminal of the oscillator), and an open-loop mode of operation in which the feedback path 514 is open (e.g., such that the ramping unit 512 is coupled to the input terminal of the oscillator while the feedback path 514 is open). In some cases, the various interconnections and functionality described above with regards to FIGS. 1-4 are also applicable to FIGS. 6-8 (and vice versa) with like reference numerals having similar functionality, albeit with some differences in functionality in some cases (e.g., oscillator 508 can have functionality similar to oscillator 108, FLL/PLL unit 510 can have functionality similar to FLL/PLL unit 110, clk_ref 505 can be similar to clk_ref 105, and so on).

In FIG. 5, the oscillator 508 of FIG. 5 is a digitally controlled oscillator (DCO) whose output frequency $f_{out}$ is controlled by a multi-bit frequency code word 509 provided at the input terminal of the DCO. In some cases, the DCO is a digital ring-oscillator that comprises a number of invertors or other time-delay elements that are connected in series with one another to establish a loop. In other embodiments the oscillator 508 can be a numerically controlled oscillator or a voltage-controlled oscillator, among others.

The controller 520 includes a characterization unit 522 and a supervision unit 524. As with the controller 120 of FIG. 1, the characterization unit 522 and the supervision unit 524 can be implemented as an ASIC, a microcontroller and memory running software or firmware, a programmable logic circuit, or other digital processing circuitry, as can the FLL/PLL unit 510, ramping unit 512, and switching unit 516.

The input settings in the supervision unit 524 define parameters for the operations of the other units, such as ramp-durations, ramp-frequency-steps, and frequency control words to be used during the characterization. Hence, the supervision unit 524 provides inputs and enable signals to all other units.

The supervision unit 524 enables the characterization unit 522 when the frequency synthesizer 502 is started. During an initial startup time period of the frequency synthesizer (and not necessarily after this initial startup time period), the characterization unit 522 receives a predetermined list of frequency code words (fcw_list) from the supervision unit 524 (and/or retrieves this list from memory, such as non-volatile memory, one-time-programmable (OTP) memory, or read-only memory (ROM)). The supervision unit 524 then enables the characterization unit 522 via an enable signal (en_char), and correspondingly sets the switching unit (via control terminal 519) to a third switch position 516c. The characterization unit 522 then applies each frequency code word from the predetermined list to the input of the DCO in a frequency code word learning sequence (fcw_learn), and records the output frequency $f_{out}$ of the DCO induced by each frequency code word by using characterization feedback loop 526. Thus, the characterization unit 522 builds a table that lists each frequency code word and the corresponding output frequency of the DCO. This table can be stored in memory, such as registers, volatile memory, non-volatile memory, or other types of memory. In some cases, the fcw_list is not a comprehensive list of all possible frequency code words that can be applied to the DCO in order to limit the amount of memory required. For example, if the DCO receives a 16-bit frequency code word that represents 65,535 different unique states, the frequency code word list may only contain a list of 256 code words such that each code word in the characterization unit 522 is only 8 bits in length to save memory and to shorten the initial startup time period.

After the characterization unit 522 completes the characterization of the output frequency of the DCO for the given number of frequency control words, the frequency synthesizer switches from start-up mode to normal operating mode. In normal operation mode, the frequency synthesizer can switch between closed-loop mode and open-loop mode. In closed-loop mode, the supervision unit 524 enables FLL/PLL unit 510 and provides FLL/PLL unit 510 with a target frequency 507, and sets the switching unit 516 to provide the FLL/PLL frequency code word (fcw_fll) 513 so the output frequency of the DCO tracks the target frequency 507.

During open loop mode, the supervision unit 524 enables the ramping unit 512 for open-loop mode. In particular, during open loop mode, the characterization data has been stored in the table in memory and is accessible by the ramping unit 512. Thus, the supervision unit 524 provides the ramping unit 512 with a ramp enable signal (en_ramp), time step size (tstep), frequency step size (fstep), and a stop frequency (fstop) at which the ramping unit is to stop ramping up or ramping down the output frequency. Upon being enabled via the ramp enable signal, the ramping unit 512 provides a sequence of frequency code words (fcw_ramp) 515 to induce an upward ramp or a downward ramp in the output frequency of the DCO. In some embodiments, the ramping unit uses interpolation-based prediction to extrapolate frequency code words between what is stored in the table generated by the characterization unit 522. Consider an example where the ramping unit 512 is requested to ramp the output frequency 503 from 100 MHz to 500 MHz in frequency steps of 1 MHz, and where the table only contains 256 frequency code words. Here 400 distinct frequency code words are needed, so the ramping unit 512 includes an interpolation unit to interpolate/generate additional frequency code words between adjacent frequency code words stored in the initial characterization table, and to insert those additional frequency code words into the fcw_ramp sequence 515 possibly along with code words selected from the frequency code word learning sequence (fcw_learn). This prediction based on interpolation enables a trade-off between frequency-accuracy and required chip area.

FIG. 6 illustrates a block diagram of the characterization unit 522 and DCO (some other components are omitted for simplicity). The characterization unit 522 includes an analog-to-digital converter 602, such as a counter-based digitization block, and a characterization state machine 604. The input en_char represents the enable signal of the characterization unit 522. Example operations of the "Characterization-State-Machine" 604 are described in the following. Assume that fcw_list is an array with 8 values of the frequency control word, for example fcw_list=[1, 32, 64, 96, 128, . . . , 256]. The Characterization-State-Machine is based on the following four acts: (1) Set fcw=fcw_list[i]; (2) wait for a predetermined number of clock cycles (e.g., 100 cycles of clk_ref); (3) Read $f_{out\_dig}$; and (4) if ftarget is larger or equal to fstop, characterization is finished, otherwise increment "i" and return to act 1 above.

FIG. 7 illustrates a block diagram of the ramping unit 512. The ramping unit 512 can be implemented with a state machine. The input "en_rmp" represents the enable signal of the ramping unit 512. The operations of the "Ramp-State-Machine" can be based on the following five acts: (1) Calculate target FCW from ftarget and dco_data via interpolation, (2) Set fcw=ftarget, (3) Wait for a time equal to tstep, (4) Update ftarget=ftarget+fstep, (5) If ftarget is larger or equal to fstop, ramp is finished, otherwise go back to act (1). Notice that the "interpolation" mentioned in act 1 above can be simple linear interpolation. In fact, depending on the DCO architecture, the DCO period or DCO frequency can be approximated well by a linear function over a small range of values of the DCO control word fcw. Other more complex interpolation, such as quadratic, exponential, or other nonlinear functions could also be used in other examples.

FIG. 8 illustrates a block diagram of the FLL/PLL unit 510. The FLL/PLL unit 510 includes an analog to digital converter 802 to convert the DCO output signal to a digital output frequency signal 804. A comparator 806 is configured to perform a comparison of the digital output frequency signal 804 and the target frequency signal 107 and to output an error signal 808 based on the comparison. An accumulator 810 is configured to accumulate values based on the error signal 808 and provide a frequency code word 812 to the first switch position of the switching unit 516. The block labelled sign(•) 814 provides the "sign" operator. The input en_fll represents the enable signal of the FLL/PLL unit 510.

Figure 9:
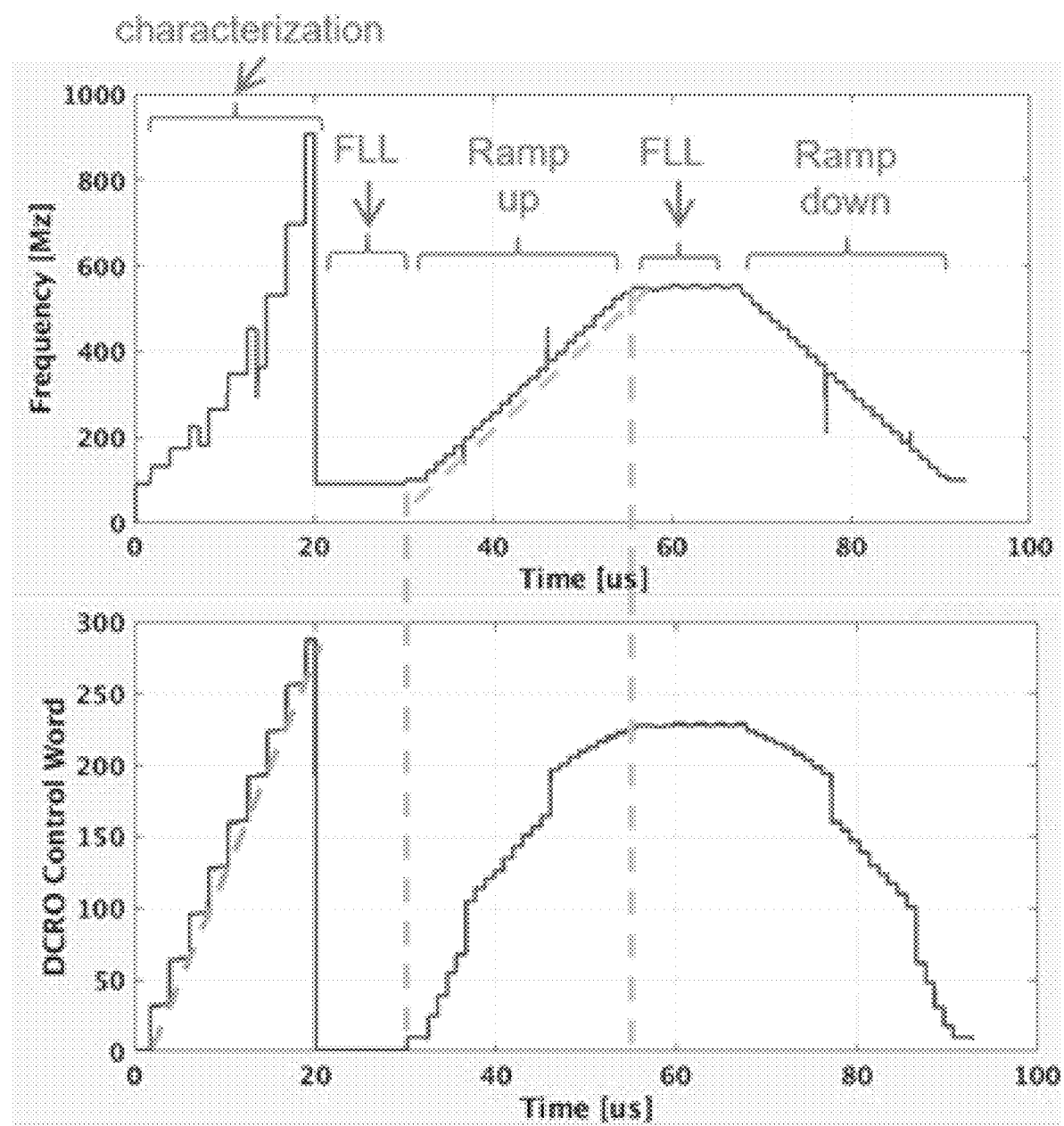
FIG. 9 illustrates additional waveform diagrams of a frequency generator in accordance with some embodiments.

FIG. 9 illustrates a simulated frequency synthesizer that implements dynamic switching between predictive open-loop operations and PLL/FLL-operations in closed loop. FIG. 9 shows the DCO frequency and DCO control word during the operations. The frequency ramps up and down in a staircase-like fashion. FLL operations are engaged after the initial characterization and after the ramp-up to 500 MHz.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

What is claimed is:

1. A frequency synthesizer, comprising:
    an oscillator comprising an input terminal and an output terminal;
    a frequency locked-loop or phase-locked loop (FLL/PLL) unit arranged on a feedback path extending between the output terminal of the oscillator and the input terminal of the oscillator;
    a ramping unit; and
    a switching unit configured to selectively switch between a first mode of operation in which the feedback path is closed and the FLL/PLL unit is coupled to the input terminal of the oscillator, and a second mode of operation in which the feedback path is open and the ramping unit is coupled to the input terminal of the oscillator while the feedback path is open; and
    wherein the ramping unit is configured to change an output frequency signal provided by the oscillator according to a predetermined frequency step size during the second mode of operation.

2. The frequency synthesizer of claim 1:
    wherein the ramping unit and the FLL/PLL unit are configured to receive a target frequency signal and provide a frequency code word to the input terminal of the oscillator based on the target frequency signal; and
    wherein the oscillator is configured to output the output frequency signal to the output terminal of the oscillator, wherein the output frequency signal generally tracks the target frequency signal in time.

3. The frequency synthesizer of claim 2, wherein the ramping unit, the FLL/PLL unit, and the switching unit are implemented as a digital circuit configured to receive the target frequency signal, and the oscillator is implemented as an analog circuit configured to output the output frequency signal to the output terminal of the oscillator.

4. The frequency synthesizer of claim 2, wherein the ramping unit is configured to iteratively adjust the frequency code word in discrete steps to adjust the output frequency signal according a first uniform step size throughout the second mode of operation.

5. The frequency synthesizer of claim 4, wherein the FLL/PLL unit is configured to adjust the output frequency signal during the first mode of operation according to different steps sizes that vary from the first uniform step size.

6. The frequency synthesizer of claim 2, further comprising:
    a controller configured to perform a comparison of the target frequency signal and the output frequency signal, and to provide a control signal to the switching unit based on the comparison.

7. The frequency synthesizer of claim 6, wherein the controller is configured to detect an increase in the target frequency signal when the switching unit is in the first mode of operation, and based on the detection of the increase in the target frequency signal, is configured to change a state of the control signal to switch the switching unit to the second mode of operation so the ramping unit is coupled to the input terminal of the oscillator during the second mode of operation.

8. The frequency synthesizer of claim 7, wherein the controller is further configured to detect when the output frequency signal is greater than or equal to an upper frequency threshold while the switching unit is in the second mode of operation, and based on the detection of the output frequency signal being greater than or equal to the upper frequency threshold, the controller is configured to change the state of the control signal to return to the first mode of operation in which the FLL/PLL unit is re-coupled to the input terminal of the oscillator.

9. The frequency synthesizer of claim 8, wherein the controller is configured to detect an decrease in the target frequency signal when the output frequency signal is greater than or equal to the upper frequency threshold, and based on the detection of the decrease in the target frequency signal, is configured to change the state of the control signal to switch the switching unit to the second mode of operation so the ramping unit is coupled to the input terminal of the oscillator during the second mode of operation.

10. The frequency synthesizer of claim 9, wherein the controller is further configured to detect when the output frequency signal is less than or equal to a lower frequency threshold while the switching unit is in the second mode of operation, and based on the detection of the output frequency signal being less than or equal to the lower frequency threshold, the controller is configured to change the state of the control signal to return to the first mode of operation in which the FLL/PLL unit is re-coupled to the input terminal of the oscillator.

11. A frequency synthesizer comprising:
an oscillator comprising an input terminal and an output terminal;
a frequency locked-loop or phase-locked loop (FLL/PLL) unit arranged on a feedback path extending between the output terminal of the oscillator and the input terminal of the oscillator;
a switching unit configured to selectively switch between a first mode of operation in which the feedback path is closed and the FLL/PLL unit is coupled to the input terminal of the oscillator, and a second mode of operation in which the feedback path is open and a ramping unit is coupled to the input terminal of the oscillator while the feedback path is open; and
a characterization unit configured to apply a first plurality of frequency code words to the oscillator and store a plurality of output frequencies, respectively, output by the oscillator in response to the first plurality of frequency code words to build an initial table including the first plurality of frequency code words and the plurality of output frequencies, respectively.

12. The frequency synthesizer of claim 11, wherein the ramping unit is configured to build a sequence of frequency code words to implement a frequency ramp function, wherein the sequence of frequency code words includes an additional frequency code word interpolated between two adjacent frequency code words in the initial table.

13. The frequency synthesizer of claim 2, wherein the FLL/PLL unit comprises:
an analog-to-digital converter to convert the output frequency signal to a digital output frequency signal;
a comparator configured to perform a comparison of the digital output frequency signal and the target frequency signal and to output an error signal based on the comparison; and
an accumulator configured to accumulate values based on the error signal to thereby generate the frequency code word.

14. The frequency synthesizer of claim 11, wherein the characterization unit comprises:
an analog-to-digital converter; and
a characterization feedback path extending between the output terminal of the oscillator and the analog-to-digital converter; and
a state-machine configured to apply the first plurality of frequency code words to the oscillator and to monitor the analog-to-digital converter for a plurality of digital output frequencies, respectively, output by the oscillator in response to the first plurality of frequency code words to build the initial table including the first plurality of frequency code words and the plurality of digital output frequencies, respectively.

15. A frequency synthesizer, comprising:
a digitally controlled oscillator (DCO) comprising an input terminal and an output terminal, and configured to provide an output frequency signal having an output frequency;
a digital circuit configured to selectively switch the DCO between a first operating mode, which occurs when the output frequency is being ramped between a first target frequency and a second target frequency, and a second operating mode, which occurs when the output frequency varies about the first target frequency or varies about the second target frequency; and
wherein the first operating mode changes the output frequency by a uniform frequency step size for consecutive time periods while the output frequency is being ramped, and the second operating mode changes the output frequency by different frequency step sizes that are different from one another and different from the uniform frequency step size while the output frequency varies about the first target frequency or varies about the second target frequency.

16. The frequency synthesizer of claim 15, wherein each of the different frequency step sizes corresponds to a first duration, and the uniform frequency step size corresponds to a second duration, the second duration being different than the first duration.

17. The frequency synthesizer of claim 15, wherein the uniform frequency step size induces a first current ripple having a first magnitude from a power supply module, and a frequency step size of the different frequency step sizes induces a second current ripple having a second magnitude from the power supply module, the second magnitude being less than the first magnitude.

18. The frequency synthesizer of claim 15, wherein the uniform frequency step size induces a first voltage ripple having a first magnitude from a power supply module, and a frequency step size of the different frequency step sizes induces a second voltage ripple having a second magnitude from the power supply module, the second magnitude being less than the first magnitude.

19. A method of generating a signal with a time-varying frequency, comprising:
providing an oscillator and a feedback path that selectively couples an output of the oscillator to an input of the oscillator; and
selectively switching between a closed-loop mode of operation in which the feedback path is closed such that the output of the oscillator is used to tune the input of the oscillator and an open-loop mode of operation in which the feedback path is open such that the input of the oscillator is driven independent of the output and the output of the oscillator changes in time according to a predetermined frequency size during the open-loop mode of operation.

20. The method of claim 19, further comprising:
applying a first plurality of frequency code words to the oscillator and storing a plurality of output frequencies, respectively, output by the oscillator in response to the first plurality of frequency code words to build an initial table including the first plurality of frequency code words and the plurality of output frequencies, respectively; and
during the open-loop mode of operation, providing a sequence of frequency code words to implement a frequency ramp function, wherein the sequence of frequency code words includes an additional frequency code word interpolated between two adjacent frequency code words in the initial table.

21. The frequency synthesizer of claim 1, wherein the FLL/PLL unit is configured to change the output frequency signal provided by the oscillator according to another frequency step size during the first mode of operation, the another frequency step size differing from the predetermined frequency step size.

22. the frequency synthesizer of claim 1, wherein the FLL/PLL unit is configured to change the output frequency signal provided by the oscillator according to another frequency step size during the first mode of operation, the another frequency step size being smaller than the predetermined frequency step size.

23. the frequency synthesizer of claim 1, wherein the FLL/PLL unit is configured to change the output frequency signal provided by the oscillator according to at least two additional frequency step sizes during the first mode of operation, the at least two additional frequency step sizes differing from one another and at least one of the at least two additional frequency step sizes being smaller than the predetermined frequency step size.

\* \* \* \* \*